United States Patent

Nitsche et al.

[11] 3,947,868
[45] Mar. 30, 1976

[54] AIR-COOLED CONVERTER ASSEMBLY, HAVING HEAT SINKS SHAPED AS ISOSCELES TRIANGLES

[75] Inventors: Herbert Nitsche, Spardorf; Günter Wittig, Erlangen, both of Germany

[73] Assignee: Siemens Aktiengesellschaft, Munich, Germany

[22] Filed: Feb. 6, 1974

[21] Appl. No.: 440,047

[30] Foreign Application Priority Data
Feb. 15, 1973   Germany............................ 2307527

[52] U.S. Cl.................................... 357/81; 165/80
[51] Int. Cl.²........................................ H01L 39/02
[58] Field of Search .................. 357/80, 81; 165/80

[56] References Cited
UNITED STATES PATENTS

| | | | |
|---|---|---|---|
| 3,428,845 | 2/1969 | Nelson................................. | 357/81 |
| 3,541,433 | 11/1970 | Davis.................................... | 357/81 |
| 3,652,903 | 3/1972 | Eriksson et al........................ | 357/81 |
| 3,771,031 | 11/1973 | Kay...................................... | 357/81 |

*Primary Examiner*—Andrew J. James
*Attorney, Agent, or Firm*—Kenyon & Kenyon Reilly Carr & Chapin

[57] ABSTRACT

An air cooled converter assembly employing disc thyristors in which the disc thyristors are clamped between conducting heat sinks, arranged in pairs side-by-side transversely to their common axis, with the disc thyristor thereby clamped essentially parallel to the front surface of the arrangement with the heat sinks as viewed from the front having essentially the outline of an isosceles right triangle.

10 Claims, 5 Drawing Figures

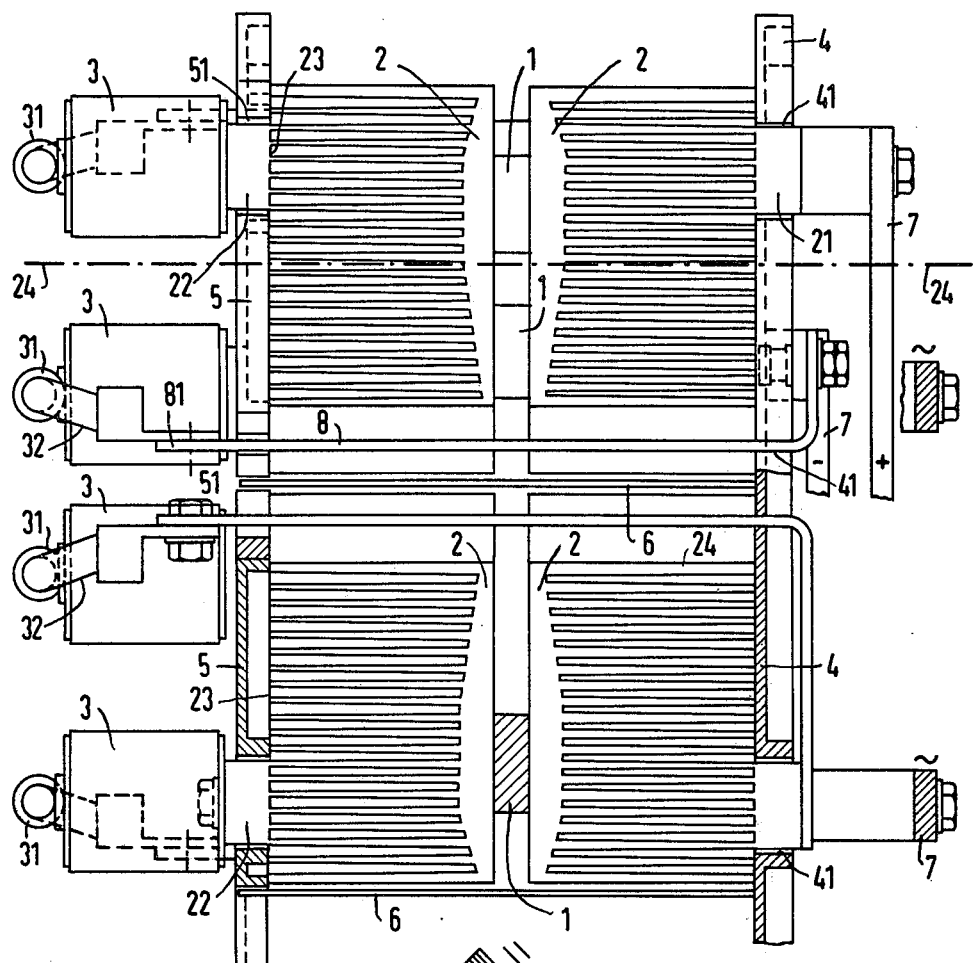
Fig. 1
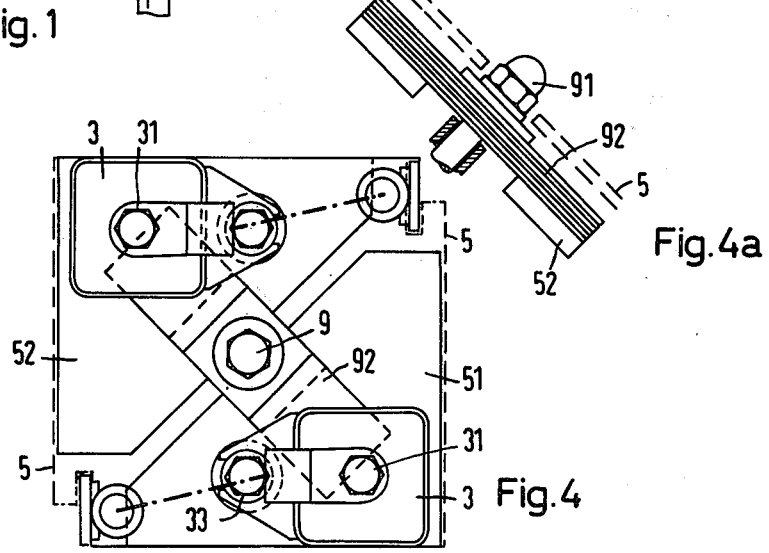
Fig. 4a
Fig. 4

AIR-COOLED CONVERTER ASSEMBLY, HAVING HEAT SINKS SHAPED AS ISOSCELES TRIANGLES

BACKGROUND OF THE INVENTION

This invention relates to air-cooled converter assemblies employing disc thyristors in general, and more particularly, to an improved arrangement which permits arranging the disc thyristors such that they are essentially parallel to the front surface of the arrangement.

Air-cooled converter assemblies using disc thyristors have previously been developed. For example, in British Pat. No. 992,442, a plurality of disc thyristors are clamped together between heat sinks arranged in tandem. The power connections are made using terminal lugs on the conducting heat sinks. Because of the nature of the design, the disc thyristors are parallel to each other with their contact surfaces and all contact surfaces are at right angles to the front surface of the converter assembly. Clearly, this does not lead to ease of connection and requires large amounts of space.

Also previously known are liquid-cooled converter assemblies employing disc thyristors in which are individually clamped and arranted with their contact surfaces parallel to the front surface of the arrangement. An example of such a device is that disclosed in German Offenlegungsschrift No. 1,924,011. This type of design, with the disc thyristor surfaces parallel to the front surface and which has not been heretofore common in air-cooled converter assemblies is possible since, with liquid-cooled disc cells, heat sinks required are not as large as those required for air-cooled operation. A typical design of an air-cooled converter assembly using the thyristors arrangement of German Offenlegungsschrift No. 1,924,011 is disclosed in detail in German Offenlegungsschrift No. 1,913,546. From the arrangement disclosed therein, it is evident that the juxtaposition of large heat sinks results in a bulky design. Furthermore, from this disclosure, it is obvious that only threaded-stud thyristors with ratings smaller than those typically found in disc thyristors can be conveniently used. Using disc thyristors in this type of design would require even larger heat sinks and thus, more space.

Thus, there is a need for an air-cooled converter assembly employing disc thyristors which includes heat sinks which are large enough to dissipate the heat produced by the thyristors and at the same time are arranged in a space saving design.

SUMMARY OF THE INVENTION

The present invention provides such an arrangement. In accordance with the present invention, a converter assembly having disc thyristors clamped between heat sinks, and which is air-cooled, has pairs of heat sinks arranged side-by-side in such a manner that the axes penetrating from the front surfaces of the heat sinks of a pair are essentially parallel to each other with a disc thyristor clamped between two heat sinks of a pair with its contact surfaces essentially parallel to the front surface of the pair of heat sinks and of the overall arrangement. Furthermore, the heat sinks are constructed so that as seen from the front surface, they have an outline which is essentially that of an isosceles triangle.

Preferably, in an arrangement of this type it is advantageous if two disc thyristors are jointly clamped with a respective two pairs of heat sinks to form an assembly which comprises essentially a retangular block having an essentially square base area. With such an arrangement, the heat sink in the rear can be made of a single piece and used for two disc thyristors. As seen from the front, it will then have an essentially square outline. In the preferred embodiment, the two disc thyristors of an assembly are clamped between their heat sinks using a spring element which is placed in an insulated manner across the front surfaces of the two heat sinks with an insulated screw brought to the center of the spring element from the front surface to a fastening device on the rear side of the assembly with the whole block-shaped assembly pressed together using the spring element and the screw connection.

With a design such as this with the parallel arrangement of the contact surfaces of the disc thyristors and the front surface of the apparatus, the equipment is easy to maintain permitting replacement of the thyristors of each pair without necessity of loosening the clamping of other thyristors while doing so. Each thyristor pair is individually accessible without affecting adjacent units. By dividing the rectangular, approximately square front surface for two adjacent pairs of heat sinks diagonally, a very compact design is obtained. In addition, a central arrangement of the disc thyristors with optimized heat removal is obtained. The thermal paths are approximately equal in all directions. By jointly clamping two adjacent disc thyristors, which in the case of a bridge circuit are usually used with a common current phase, it becomes possible to obtain substantially equal contact pressure for the two disc thyristors of a current phase, using the diagonally arranged leaf spring and screw connection. At the same time, using a common rear heat sink allows a single unit to provide individually clamped bridge elements belonging to a single current phase, thereby greatly simplifying the installation and making diverse applications of the assembly possible.

BRIEF DESCRIPTION OF DRAWINGS

FIG. 1 is a plan view, partially in cross section illustrating two sets of two disc thyristors each, along with their heat sinks and associated fuses and connecting bus bars.

FIG. 4 is a front view of a heat sink and thyristor arrangement of the present invention, showing the joint clamping of two disc thyristors.

FIG. 4a. is a partial sectional view of the clamping arrangement of FIG. 4.

DETAILED DESCRIPTION OF THE PREFERRED EMBODIMENT

Figure 2:
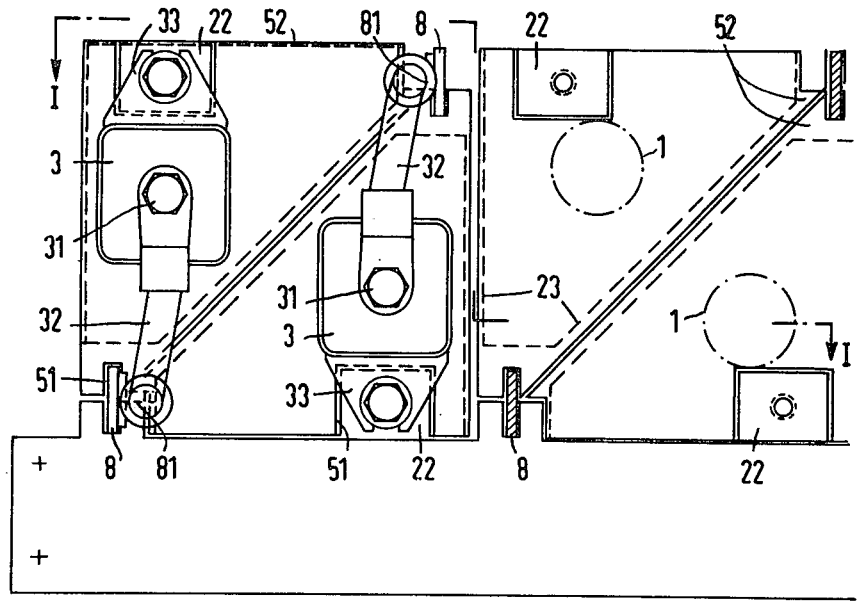
FIG. 2 is a front view of the arrangement of FIG. 1.

FIG. 1 illustrates two of what would normally be three assemblies according to the present invention. Although only two assemblies are shown, assemblies such as that to be described will normally be found in groups of three, particularly when used in three-phase bridge circuits. In the illustrated embodiment, the front of the overall assembly is in the left and the back to the right. A piece of insulating material 4 serves as the base member for the arrangement. The base 4 is provided with a plurality of feedthroughs 41 for connecting to the power bus bars 7 or power cables. The power bus bars are either connected directly to bosses 21 of the heat sinks 2, or to current carrying bars 8 which are arranged in an insulated manner running from the front of the assembly to the rear. At the front, for covering the thyristor assemblies at that point, plates 5, made of insulating material are installed, which plates have cutouts 51 for bringing out the connection bosses 22 of the heat sinks 2, along with the current carrying bars in a manner such that they are insulated. The heat sinks 2 between which the disc thyristors 1 are clamped, are thus situated between two plates of insulating material. As illustrated, the current carrying bar 8 is led in an insulated manner from the front to the rear. In order to permit insulation of the individual assemblies from each other, plates 6 of insulating material are also installed. When used in a bridge circuit, the two disc thyristors clamped between a pair of heat sink 2 will preferably be assigned to one current phase. In that case, the heat sink 2 at the rear can be made of a single piece for two disc thyristors so that the overall assembly will have an essentially square shape as seen from the front. This shape is more clearly illustrated on FIGS. 2 and 4, to be described in detail below. Also illustrated on FIG. 1 are branch fuses 3. Branch fuses herein refer to fuses associated with the individual branches of the converter (in contrast to phase fuses which are fuses for each a-c circuit.) As shown, the branch fuses 3 are attached to the connection bosses of the heat sink 2. The fuses 3 are then connected by their connecting lugs 31 to lugs 81 of the current carrying bars 8 by means of a cable 32. By using the current carrying bar 8 running to the rear of the assembly, all power connections can be made from the rear and all control connections from the front.

FIG. 2 is a front view of the arrangement of FIG. 1. In this figure, the fuses have been omitted in the assembly to the right for sake of clarity. FIG. 2 illustrates clearly that the two pairs of heat sinks are arranged side-by-side in such a manner that the axes 24 of FIG. 1, which pass through the front surfaces 23 of the heat sinks of a pair, are parallel to each other. From this figure it is also clearly seen that the heat sinks as viewed from the front have an outline which is essentially that of an isosceles right triangle. The heat sinks, which are located below the plate of insulating material 5 (see FIG. 1) are shown in dotted lines. The connection bosses 22 of the heat sinks along with the current carrying bars 8 are brought through the cutouts 51 of the front insulating plate 5. The lugs 33 of the fuses 33 are connected to the connection bosses 22 of the heat sinks. With their second terminal 31, the fuses 3 are connected to the lugs 81 of the current carrying bars 8 through current carrying cables 32. The geometrical arrangement of the disc thyristors 1 is best illustrated by the assembly to the right where the disc thyristors are shown in broken lines. The indication on this figure of the cross section I-I shows the plane of the cross section of FIG. 1.

Figure 3:
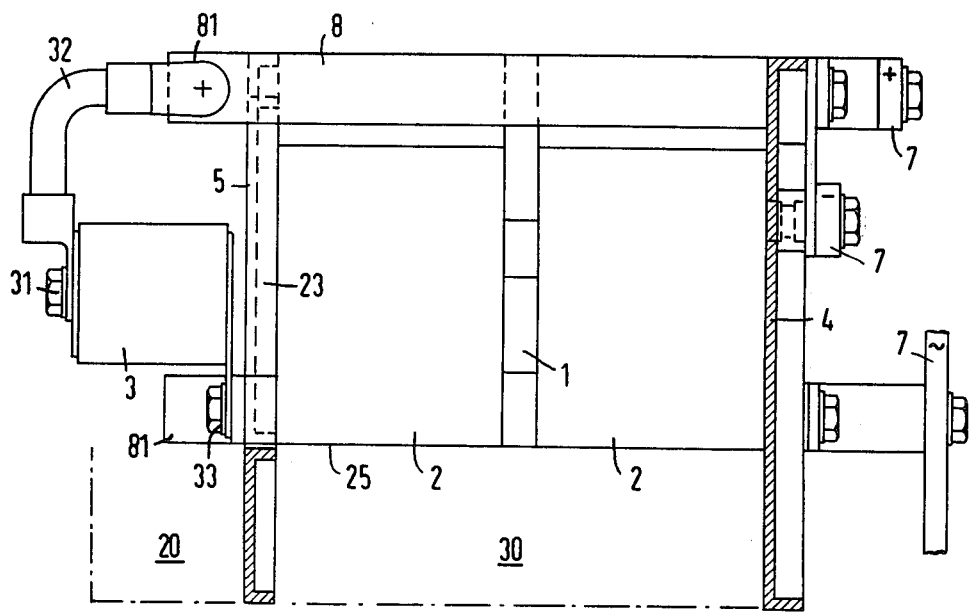
FIG. 3 is a second side view of a portion of the arrangement of FIG. 1, partially schematic in form, illustrating various interconnections.

FIG. 3 is a side view of the arrangement of FIG. 1. Again, the geometrical position of the disc thyristors 1 is illustrated. The insulating plates 4 and 5 insulate the arrangement at each side. The individual polarity of the bus bars 7 is shown to illustrate the fact that all power connections can be made from the rear. This figure illustrates particularly well the attachment of the fuse 3 which has its one lug 33 connected to a connection boss 22 of the heat sink and its other lug 31 connected to a lug 81 of the current carrying bar 8 through a current carrying cable 32. As illustrated, underneath the heat sinks 2, a separate space 30 is provided in which associated circuitry subassemblies may be placed. In this regard, it is also possible to assign a circuit separately to each disc thyristor. The dot-dash frame of the box 20 is indicated to schematically illustrate the fact that a driver group can be attached directly to the thyristor assembly. The driver assembly will advantageously be constructed, as a common assembly for driving all thyristors, on a single circuit board.

FIG. 4 illustrates the mechanical device used for clamping the disc thyristors between two heat sinks as viewed from the front. FIG. 4a. is a side view of a screw 91 and associated spring element 92. In assembling a thyristor assembly, the rear plate of insulating material 4 along with the rear heat sink made of a single piece serves as the base element. To this space element are then mounted in succession, the heat sinks and the disc thyristors. The heat sinks in front are covered at their front surface 23 with plates 52 of insulating material to provide insulation for the spring element. At least one spring element 92 is placed over these cover plates with the spring element having a screw connection 9 provided in its center as viewed from the front. The front side of the thyristor assembly is tensioned against the rear side using the screw 91, the spring element 92 and the insulating plates 52. Because of the design of the spring element, which is supported at three points, a uniform contact pressure for both disc thyristors of an assembly is achieved. The pressure provided by the screw connection 9 is distributed uniformly over both halves of the assembly by means of the spring element 92. After clamping, the front surface of the assembly is insulated from the outside by a plate of insulating material 5, as illustrated on FIGS. 1 and 3.

As illustrated on FIG. 1, the fins of the heat sinks 2 are arranged so that they are at right angles to the front surface 23 and to the bottom side 25 of the arrangement, thereby forming air ducts through which cooling air may be passed, the ducts being formed by the heat sinks in combination with the front and rear insulating plates 5 and 4 respectively.

Thus, an improved air-cooled converter arrangement in which disc thyristors are clamped between pairs of heat sinks with the heat sinks having essentially the outline of an isosceles right triangle has been shown. Although a specific embodiment has been illustrated and described, it will be obvious to those skilled in the art that various modifications may be made without departing from the spirit of the invention which is intended to be limited solely by the appended claims.

We claim:

1. In an air-cooled converter assembly in which disc thyristors are clamped between electrically conductive heat sinks, an arrangement which saves space and permits ease of connection comprising:
   a. a plurality of heat sinks each having a front surface, a back surface and a plurality of side surfaces, at least some of said heat sinks having front and back surfaces essentially in the shape of an isosceles triangle;
   b. a plurality of disc thyristors each disc thyristor clamped between two heat sinks at least one of which has front and back surfaces in the shape of an isosceles triangle, said disc thyristors having their surfaces clamped in contact with the back surfaces of the heat sinks between which they are clamped, the heat sinks having essentially parallel front and back surfaces so that the contact surfaces of said disc thyristors are essentially parallel to the front surfaces of said heat sinks between which they are clamped; and c. said disc thyristors grouped in pairs with each pair of disc thyristors jointly clamped between their associated pairs of heat sinks so that their associated heat sinks having front and rear surfaces shaped as an isosceles triangle lie adjacent each other along their hypotenuses.

2. A converter assembly according to claim 1 wherein the two disc thyristors are clamped by means comprising:

a. at least one spring element placed over and contacting the front surfaces of the two front heat sinks of the thyristors;

b. means insulating said spring from said heat sinks;

c. a screw passing through the center of the spring element from the front surface and extending to the rear;

d. a fastening device engaging said screw at the rear whereby the block-shaped assembly is pressed together using said spring element and said screw connecting and fastening device.

3. A converter assembly according to claim 2 wherein said fastening device is at the rear side of a heat sink made of one piece and which is common to two disc thyristors.

4. A converter assembly according to claim 2 and further including a plate of insulating material, insulating said fastening device from said rear heat sink.

5. A converter assembly according to claim 4 wherein said means for insulating said spring element from the front surfaces of said heat sinks comprises an individual insulating member covering each of said heat sink front surfaces.

6. A converter assembly according to claim 5 and further including a first insulating plate covering each thyristor assembly at the front surface, and a second insulating plate covering each thyristor assembly at the rear surface.

7. A converter assembly according to claim 6 wherein the cooling fins of the heat sinks are arranged at right angles to the front surface of the arrangement and to the bottom side thereof so as to form air ducts for cooling air between the first and second plates of insulating material.

8. A converter assembly according to claim 7 and further including additional insulating plates insulating individual thyristor assemblies from each other. of each sink.

9. A converter assembly according to claim 1 and further including current carrying bars running from the front surface to the rear surface of the assembly and means insulating said current carrying bars.

10. A converter assembly according to claim 1 wherein each disc thyristor is clamped between a rear heat sink having front and back surfaces which are essentially square shaped and a front heat sink having front and back surfaces essentially shaped as an isosceles triangle, two of said front heat sinks being used to clamp the two disc thyristors to a single rear heat sink, with a plurality of said pairs of clamped disc thyristors and their associated heat sinks arranged side by side in said converter assembly.

* * * * *